(12) United States Patent
Kudo et al.

(10) Patent No.: US 7,952,327 B2
(45) Date of Patent: May 31, 2011

(54) ASSEMBLED BATTERY TOTAL VOLTAGE DETECTION AND LEAK DETECTION APPARATUS

(75) Inventors: Akihiko Kudo, Ibaraki (JP); Masaki Nagaoka, Saitama (JP); Akihiko Emori, Ibaraki (JP); Takahiro Kawata, Ibaraki (JP)

(73) Assignee: Hitachi Vehicle Energy, Ltd., Ibaraki (JP)

( * ) Notice: Subject to any disclaimer, the term of this patent is extended or adjusted under 35 U.S.C. 154(b) by 722 days.

(21) Appl. No.: 11/736,294

(22) Filed: Apr. 17, 2007

(65) Prior Publication Data

US 2008/0054907 A1 Mar. 6, 2008

(30) Foreign Application Priority Data

Sep. 6, 2006 (JP) .................... 2006-241345

(51) Int. Cl.
*H02J 7/00* (2006.01)
*H02J 7/04* (2006.01)

(52) U.S. Cl. ........ 320/116; 320/134; 320/135; 320/136; 320/158

(58) Field of Classification Search ............... 320/134, 320/135, 136, 151, 152, 155, 156, 158
See application file for complete search history.

(56) References Cited

U.S. PATENT DOCUMENTS

| | | | |
|---|---|---|---|
| 2003/0094954 A1* | 5/2003 | Mashiko | 324/522 |
| 2006/0006840 A1* | 1/2006 | Furukawa | 320/116 |
| 2006/0012336 A1* | 1/2006 | Fujita | 320/119 |
| 2007/0285057 A1* | 12/2007 | Yano | 320/116 |

FOREIGN PATENT DOCUMENTS

| | | |
|---|---|---|
| DE | 103 04 234 A1 | 8/2004 |
| DE | 10304234 | 8/2004 |
| JP | 08-070503 | 12/1996 |

OTHER PUBLICATIONS

First Office Action (including English translation) issued by The State Intellectual Property Office of China for Chinese Patent Application No. 2007100913984, dated Jul. 10, 2009.
European Search Report issued by the European Patent Office for Application No. EP 07 10 5747 completed on Dec. 3, 2007, 2 pages.
Office Action (including English translation) for Korean Patent Application No. 2007-0031412, mailed Dec. 23, 2009.

* cited by examiner

*Primary Examiner* — Edward Tso
*Assistant Examiner* — Alexis Boateng
(74) *Attorney, Agent, or Firm* — Jason H. Vick; Sheridan Ross P.C.

(57) ABSTRACT

The present invention provides an assembled battery total voltage detection and leak detection apparatus which is reduced in size and is reduced in manufacturing costs. Detection of a total voltage is performed at a measurement time of a total voltage of an assembled battery 1 by connecting an output of a positive electrode resistance voltage dividing circuit composed of resistors 9 and 10 to + input of a differential amplifier 20 and connecting an output of a negative electrode resistance voltage dividing circuit composed of resistors 12 and 11 to − input of the amplifier 20, and it performs leak detection at a leak detection time by connecting an output of a positive electrode resistance voltage dividing circuit to + input of the amplifier 20 and connecting + input of the amplifier 20 to the minus input of the differential amplifier 20 to measure an output voltage of the amplifier 20. The total voltage detection and the leak detection can be performed without requiring an insulation type voltage sensor, an insulation power source, photo-couplers, or the like.

10 Claims, 4 Drawing Sheets

Prior Art

ASSEMBLED BATTERY TOTAL VOLTAGE DETECTION AND LEAK DETECTION APPARATUS

FIELD OF THE INVENTION

The present invention relates to an assembled battery total voltage detection and leak detection apparatus.

For example, a total voltage detection circuit with insulated input and output is conventionally used in a battery for a pure electric vehicle (PEV) or a hybrid electric vehicle (HEV). The reason why the insulation is required is because such a danger may occur that, when high voltage short-circuits to a chassis ground, a vehicle occupant gets a shock. Therefore, a control circuit connected to the chassis ground of a vehicle and a circuit for a high voltage system are insulated from each other in a DC current manner. A value of a resistance for the insulation is generally required to have a very high value such as 10 MΩ or more. As the circuit configuration, means for voltage-dividing an assembled cell voltage to measure a voltage by using an AD converter and transmitting a signal while performing insulation by using a photo-coupler, means for converting an assembled cell voltage to a current via a resistance and performing current-to-voltage conversion while performing insulation by using a hall element to measure the current as a voltage, or the like is adopted.

FIG. 2 shows one example of the circuit configuration. A total voltage of an assembled battery is divided to a low voltage by using resistors 2 and 3 so that the low voltage constitutes an input voltage into an AD converter 4. The AD converter 4 operates with an insulation power source 6 utilizing a reference voltage source 5 as a reference voltage. The AD converter 4 performs operation control and data communication with a microcomputer (MC) 7 which is insulated from the AD converter 4 via a photo-coupler portion 7 and operates with a power source insulated from a high voltage system.

As a leak detection circuit, a circuit where a series circuit composed of a capacitor and a resistor is connected to a terminal of a direct current power source terminal with a high voltage, and leak is detected from an amplitude of an AC voltage component generated at a connection point of the capacitor and the resistor obtained by applying a rectangular wave to the side of the resistor has been known (e.g., Japanese Patent No. 2933490). As shown in FIG. 3, a circuit where a voltage-dividing circuit having a high resistance value is provided between a total voltage terminal of an assembled battery and a ground (GND) of a control circuit, and leak determination is performed by measuring a divided voltage has been known. In the latter circuit, a voltage of the assembled battery is divided by using resistors 9, 10, 11, and 12, and a connection point of the resistors 10 and 11 is connected to a ground. Voltages at the resistors 10 and 11 constitute inputs to comparators 13 and 15 which are compared with voltages at reference voltage portion 14 and a reference voltage portion 16. Outputs of the comparators 13 and 15 are insulated via a photo-coupler portion 17 to be detected through input ports of a microcomputer 8. The reference voltage portions 14 and 16 are controlled through the photo-coupler portion 17 from the microcomputer 17, and output voltages thereof are variable. The insulation power source 18 supplies power to the comparators 13 and 15 and the reference voltage portions 14 and 16.

With such a configuration, when a leak resistance is infinitely large, voltages at both ends of the resistor 10 and the resistor 11 are the same and they are proportion to a voltage of the assembled battery. As shown in FIG. 3, when the leak resistance 18 exists between a plus (+) terminal of the assembled battery 1 and the ground, the series resistance of the resistors 9 and 10 is connected with the leak resistance 18 in parallel so that voltages at the ends of the resistor 9 and the resistor 10 are reduced as compared with the case that the leak resistance is infinitely large. Therefore, a voltage at both ends of the resistor 10 also decreases. Thereby, the comparator 13 operates to allow leak detection by performing appropriate selection while making the voltage of the reference voltage source 14 proportional to the total voltage of the assembled battery 1. In the case, an output voltage of the reference voltage portion 14 may be controlled according to the total voltage of the assembled battery 1. In this example, the case that the leak resistance is connected between the plus terminal of the assembled battery 1 and the ground is explained, but when a leak resistance exists between the minus (−) terminal of the assembled battery 1 and the ground, a voltage at ends of the resistor 11 decreases, so that leak detection can be performed by the comparator 15 like the above.

FIG. 4 shows a result obtained by realizing the configuration shown in FIG. 3 using an assembled battery composed of 96 unit cells connected in series and actually measuring both ends of the resistor 10. As shown in FIG. 4, according to reduction of leak resistance, a voltage at both ends of the resistor 10 becomes small so that leak can be detected. Incidentally, since insulation is required between the assembled battery and the control circuit, it is necessary to use a resistor having a very large value as the resistor used as the voltage-dividing resistance, so that such a very large value is generally achieved by connecting a plurality of resistors having a high resistance value in series.

However, in the conventional total voltage detection circuit and leak detection circuit for an assembled battery, there is a problem that an insulation type voltage sensor, an AD converter, an insulation power source, photo-couplers, or the like is required, which results in an increase in manufacturing costs. Since the precision of the reference voltage of the AD converter must be made high in order to achieve accurate total voltage and leak detection of the assembled battery, which also results in an increase in a cost of the reference voltage source. Of course, in the conventional circuit, there is such a problem that many parts are required and a large area of a circuit board is required.

SUMMARY OF THE INVENTION

In view of these circumstances, an object of the present invention is to provide an assembled battery total voltage detection and leak detection apparatus which is reduced in size and reduced in costs.

In order to achieve the above object, according to the present invention, there is provided an assembled battery total voltage detection and leak detection apparatus comprising: a control circuit which measures a total voltage of an assembled battery; a first resistance voltage dividing circuit which is inserted between a positive electrode terminal of the assembled battery and a ground terminal of the control circuit; and a second resistance voltage circuit which is inserted between a negative electrode terminal of the assembled battery and the ground terminal of the control circuit, wherein the control circuit measures output voltages of the first and second resistance voltage dividing circuits, detects a total voltage of the assembled battery based upon a sum of absolute values of the measured output voltages of the first and second resistance voltage dividing circuits, and detects leak between the assembled battery and the ground according to a ratio of the measured output voltage of the first resistance voltage dividing circuit and the sum of the absolute values of the measured output voltages of the first and second resistance voltage dividing circuits.

In the present invention, the control circuit measures the output voltages of the first and second resistance voltage dividing circuits, detects the total voltage of the assembled battery based upon the sum of the absolute values of the measured output voltages of the first and second resistance voltage dividing circuits, and detects leak between the assembled battery and the ground according to the ratio of the output voltage of the first resistance voltage dividing circuit and the sum of the absolute values of the output voltages of the first and second resistance voltage dividing circuits. FIG. 5 shows a ratio of the output voltage of the first resistance voltage dividing circuit to the sum of the absolute values of the output voltages of the first and second resistance voltage dividing circuits when leak resistance exists between the positive electrode terminal of the assembled battery and the ground in the case that the total voltage of the assembled battery is changed. When the leak resistance is infinitely large, the ratio reaches 50%, and the ratio lowers according to a decrease in the leak resistance, so that detection of the leak resistance becomes possible regardless of the voltage of the assembled battery. Therefore, according to the present invention, an assembled battery total voltage detection and leak detection apparatus with a reduced size which is reduced in manufacturing costs can be realized without using an insulation type voltage sensor, an AD converter, an insulated power source, or photo-couplers.

In the present invention, resistors constituting the first and second resistance voltage circuits are set to have at least specified insulation resistance values, so that a specified insulation state between the assembled battery (a high voltage system circuit) and the ground can be secured. The control circuit has a differential amplifier, and the control circuit may be configured to perform detection of a total voltage of the assembled battery at a total voltage measurement time by connecting the output of the first resistance voltage dividing circuit to a positive input terminal of the differential amplifier and connecting the output of the second resistance voltage dividing circuit to a negative input terminal of the differential amplifier to measure an output voltage of the differential amplifier, and perform leak detection at a leak detection time by connecting the negative input terminal of the differential amplifier to the ground to measure an output voltage of the differential amplifier. At this time, when the differential amplifier is mounted on an integrated circuit that the negative input terminal can be switched to the ground, the number of parts for using the integrated circuit can be largely reduced so that reliability can be raised, and precision can be raised by trimming resistance for differential amplification.

According to the present invention, since the control circuit measures output voltages of the first and second resistance voltage dividing circuits, detects a total voltage of the assembled battery based upon the sum of the absolute values of the measured output voltages of the first and second resistance voltage dividing circuits, and detects leak between the assembled battery and the ground according to the ratio of the output voltage of the first resistance voltage dividing circuit and the sum of the absolute values of the output voltages of the first and second resistance voltage dividing circuits, an assembled battery total voltage detection and leak detection apparatus with a reduced size which is reduced in manufacturing costs can be realized without using an insulation type voltage sensor, an AD converter, an insulated power source, or photo-couplers.

DETAILED DESCRIPTION OF THE PREFERRED EMBODIMENTS

An embodiment of an assembled battery total voltage detection and leak detection apparatus according to the present invention will be explained below.

Figure 1:
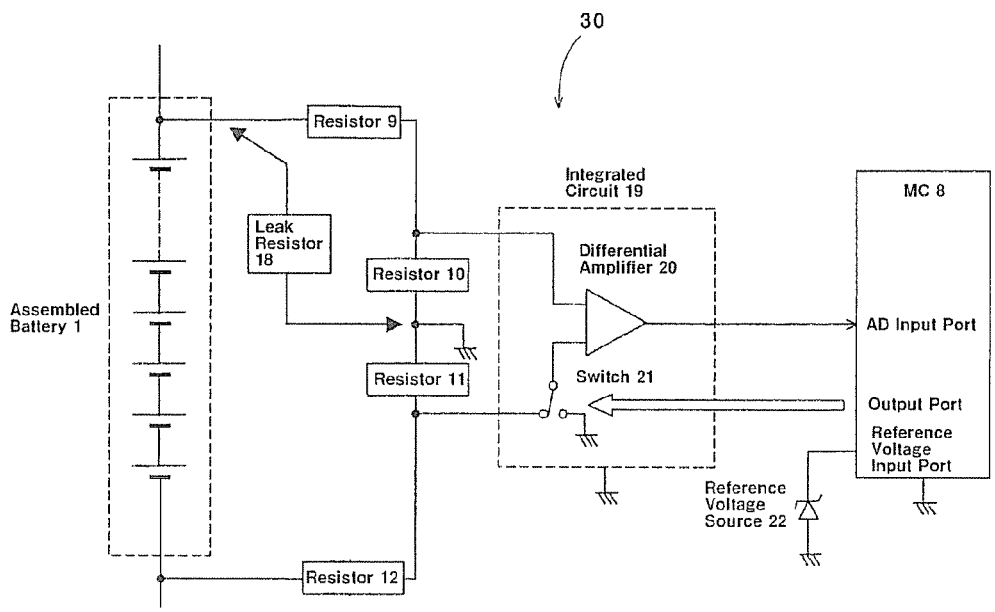
FIG. 1 is a circuit diagram of a detection circuit to which the present invention can be applied.
Figure 2:
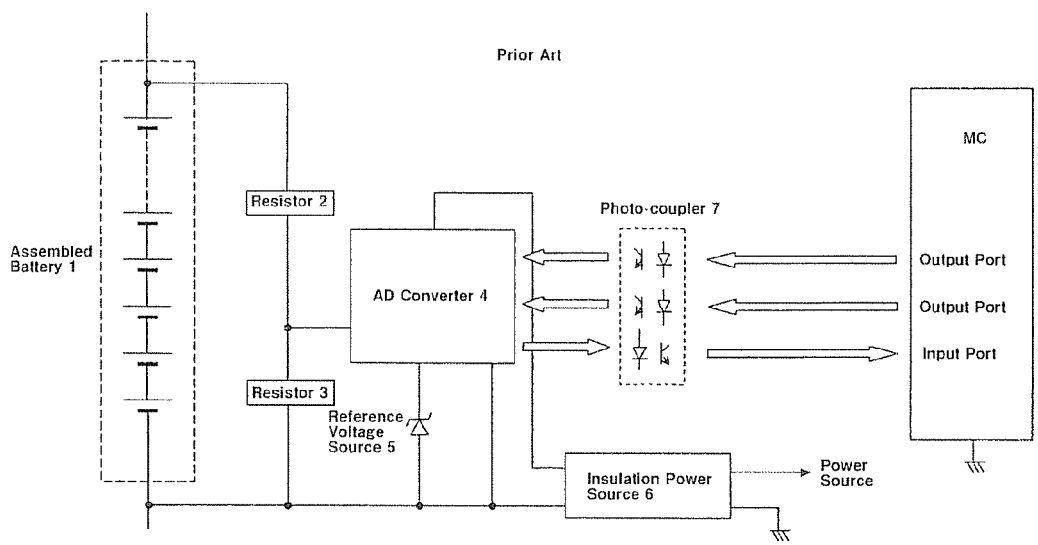
FIG. 2 is a circuit diagram of a conventional total voltage detection circuit.
Figure 3:
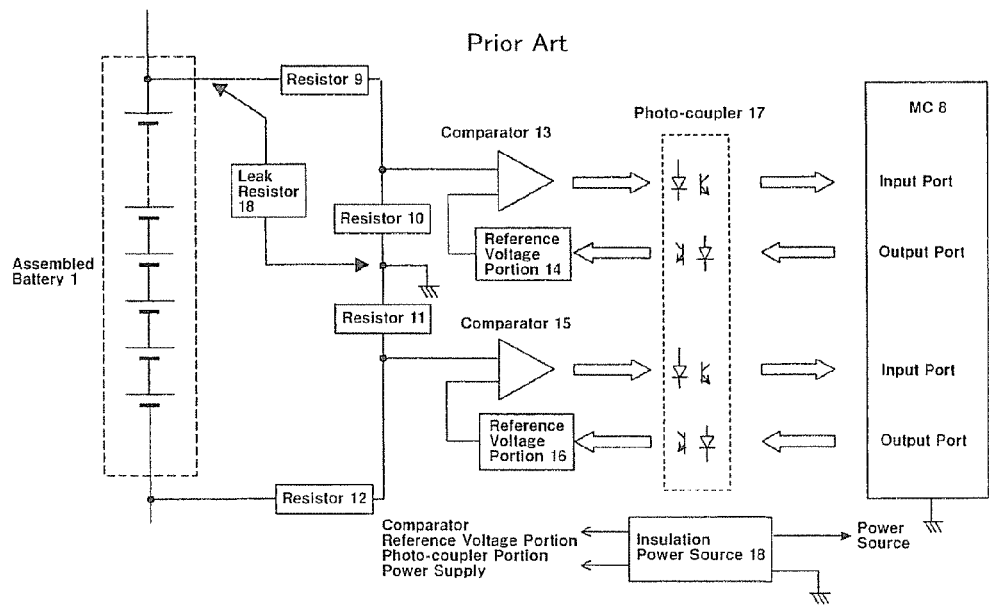
FIG. 3 is a circuit diagram of a conventional leak detection circuit.
Figure 4:
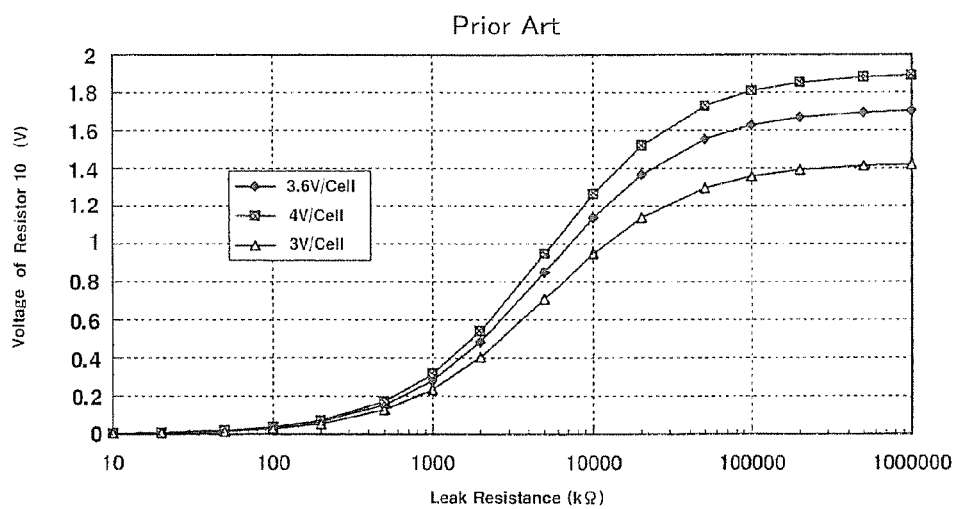
FIG. 4 is a characteristic diagram showing a relationship between a leak resistance and a voltage of a resistor 10 obtained when a voltage of an assembled battery is changed by the conventional leak detection apparatus.

As shown in FIG. 1, a detection apparatus 30 of this embodiment has voltage-dividing resistors 9 to 12, an integrated circuit 19 incorporating a differential amplifier 20 therein, a microcomputer (hereinafter, abbreviated as "MC") 8 which fetches an output from the integrated circuit 19 via an incorporated AD converter to detect a total voltage of an assembled battery 1 and serves as a part of the control circuit for detecting leak between the assembled battery 1 and the ground, and a reference voltage source 22 which applies a reference voltage to the AD converter incorporated into the MC 8.

The assembled battery 1 is a unit cell group obtained by connecting many unit cells in a series or series-parallel manner, and when it is used as a power source for an electric vehicle, for example, a secondary cell such as a lithium-ion cell or a nickel-hydrogen cell can be used as the unit cell.

The resistors 9 and 10 serving as a part of a first resistance voltage dividing circuit are connected to a positive terminal of the assembled battery 1 in series and an other end of the resistor 10 is connected to a ground (GND). On the other hand, the resistors 12 and 11 serving as a part of a second resistance voltage dividing circuit is connected to a negative electrode terminal of the assembled battery 1 in series and an other end of the resistor 11 is connected to the ground. The ground has the same potential as the ground terminal of the MC 8. In other words, the resistors 9 and 10 constitute a positive electrode (first) resistance voltage dividing circuit and the positive electrode resistance voltage dividing circuit is inserted between positive electrode of the assembled battery 1 and the ground terminal of the MC 8. The resistors 12 and 11 constitute a negative electrode (second) resistance voltage dividing circuit, and the negative electrode resistance voltage dividing circuit is inserted between a negative electrode terminal of the assembled battery 1 and the ground terminal of MC 8. It is preferable that resistance values of the resistor 12 and 11 are, for example, at least 10 kΩ. Ones having high resistance values are used as the resistors 9 and 12, and an insulation resistance value between the assembled battery 1 and the ground terminal of the MC 8 is set to have at least a specified insulation resistance value (for example, a specified insulation resistance value required for a vehicle, when the assembled battery 1 is a power source for the vehicle).

The integrated circuit 19 has therein a differential amplifier 20 having a switch 21 that a negative input terminal (a minus input terminal) of the differential amplifier 20 can be switched to a ground. That is, the negative input terminal of the differential amplifier 20 is connected to the switch 21 composed of an FET or the like, one end of the switch 21 is connected to a connection point of the resistors 12 and 11 constituting the negative electrode resistance voltage dividing circuit, and another end thereof is connected to the ground. The positive input terminal (a plus input terminal) of the differential amplifier 20 is connected to a connection point of the resistors 9 and 10 constituting the positive electrode resistance voltage dividing circuit. The ground terminal of the integrated circuit 19 is connected to a ground having the same potential as the MC 8. Incidentally, in FIG. 1, resistors for activating the differential amplifier 20 and the switch 21 appropriately are omitted.

The MC 8 is configured to contain a CPU, a ROM, a RAM, an AD converter, and a DA converter. An output port of the MC 8 is connected to a terminal for controlling the switch 21 in the integrated circuit 19, and an AD input port of the MC 8 is connected to an output terminal of the differential amplifier 20 in the integrated circuit 19. The MC 8 has a reference voltage input port and the reference voltage input port is connected to a reference voltage source 22. Incidentally, an output port is connected to the DA converter, the AD input port is connected to the AD converter, and the reference voltage input port is connected to the AD converter within the MC 8.

A total voltage of the assembled battery 1 is measured by outputting a signal (for example, a high level signal) from the output port of the MC 8 to the switch 21 to connect the switch 21 to the negative electrode resistance voltage dividing circuit of the assembled battery 1, and converting an output voltage of the differential amplifier 20 to a digital voltage value by the AD converter in order to fetch the same as a total voltage measurement value. On the other hand, the differential amplifier 20 outputs a voltage of the positive electrode resistance voltage dividing circuit of the assembled battery 1 by outputting a signal (for example, a low level signal) from the output port of the MC 8 to the switch 21 to switch the switch 21 of the integrated circuit 8 to the ground side. The MC 8 performs a determination about leak detection by converting the voltage to a digital voltage value by the AD converter in order to fetch the same as a leak detection measurement value and calculating a ratio of a leak detection measurement value to a total voltage measurement value.

Incidentally, in the detection apparatus 30 of the embodiment, since the AD converter in the MC 8 which is a main control circuit element is used for measurement, the reference voltage source 22 connected to the MC 8 can be used so that it is unnecessary to provide a special reference voltage source which is required for the conventional total voltage detection and leak detection circuit. In the detection circuit 30 of the embodiment, since detection precision of a total voltage and leak depend on the resistance values of the resistors 9 to 12, precise resistors may be used according to necessity.

EXAMPLE

Total voltage detection and leak detection were actually conducted with a circuit configuration shown in FIG. 1. In the circuit shown in FIG. 1, 96 lithium-ion cells connected in series were used as the assembled battery 1, the resistors 9 and 12 of the voltage dividing resistors were each composed of 10 resistors with a resistance value of 1MΩ connected in series, and the resistors 10 and 11 each have a resistance value of 100 kΩ. An amplification ratio of the differential amplifier 20 was set to 1 and an input range of the AD converter in the MC 8 was set in a range of from 0 to 5V.

Figure 5:
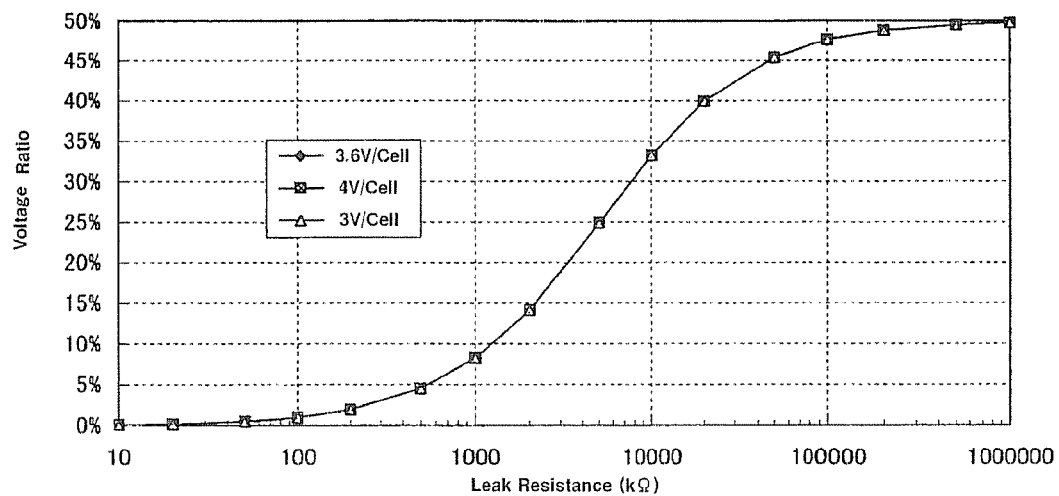
FIG. 5 is a characteristic diagram showing a ratio of the sum of absolute values of output voltages of first and second resistance voltage dividing circuits to a leak resistance obtained when a voltage of an assembled battery is changed by an assembled battery total voltage detection and leak detection circuit of the present invention.
Figure 6:
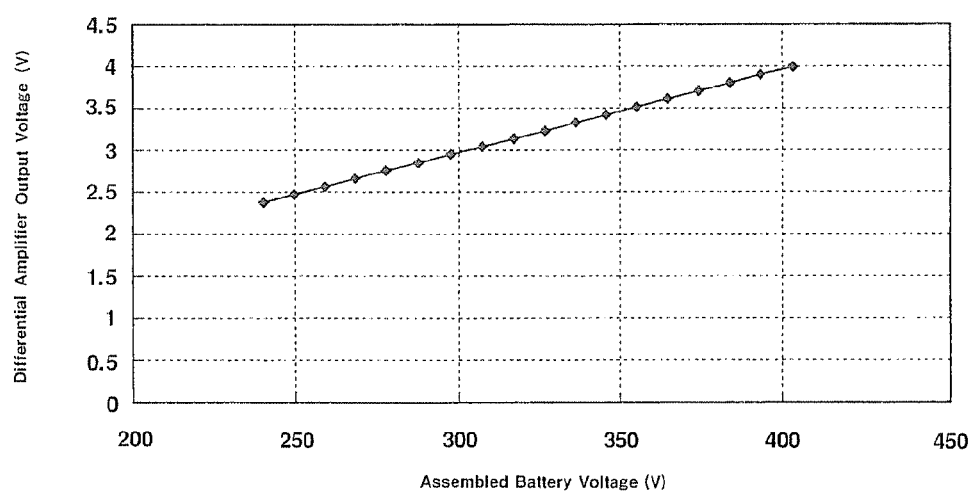
FIG. 6 is a characteristic diagram showing total voltage detection characteristic in the detection apparatus of Example.
Figure 7:
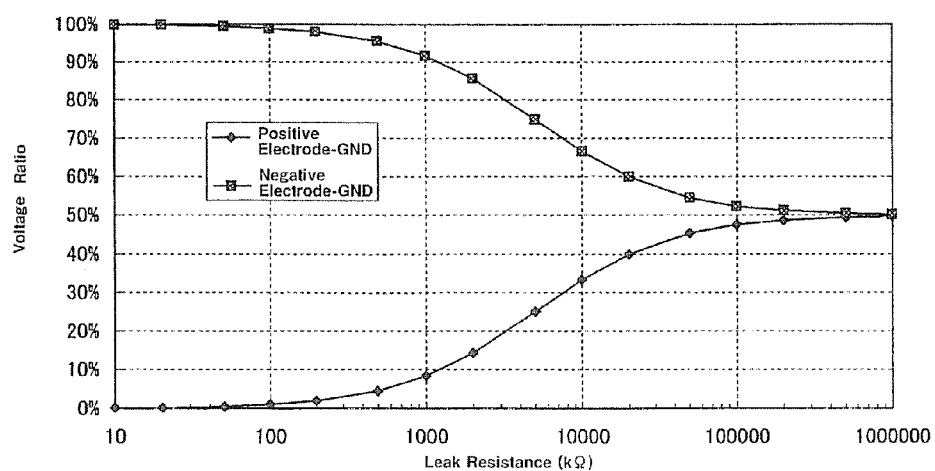
FIG. 7 is a characteristic diagram showing leak detection characteristic in the detection apparatus of the Example.

FIG. 6 shows characteristic between an output voltage of the differential amplifier 20 and a total voltage of the assembled battery 1 obtained when the output voltage of the differential amplifier 20 was measured by the MC 8 while changing a voltage of the assembled battery 1 on the above constants. As shown in FIG. 6, the measurement voltage changes in proportion to the total voltage of the assembled battery 1 so that measurement of the total voltage is made possible. FIG. 7 shows characteristic obtained by connecting a resistor between the positive terminal and the negative terminal of the assembled battery 1 to perform leak detection. As shown in FIG. 7, a ratio of a leak detection measurement value to a total voltage measurement value (a voltage ratio) changes according to a change in a resistance value of the leak resistor 18 (see FIG. 1), which allows leak detection. Accordingly, in the embodiment, a table (or a correlation equation) shown in FIG. 5 and FIG. 6 is preliminarily stored in the ROM of the MC 8, and leak detection is performed by looking up the table developed in the RAM (or calculating it with the correlation equation) to obtain a total voltage of the assembled battery 1 and further calculating a resistance value of the leak resistance to make a determination about whether or not the resistance value of the leak resistance is less than a predetermined value.

Since the detection circuit 30 of the embodiment performs detection of the total voltage at a measurement time of the total voltage of the assembled battery 1 by connecting the output of the positive electrode resistance voltage dividing circuit to the positive input terminal of the differential amplifier 20 and connecting the output of the negative electrode resistance voltage dividing circuit to the negative input terminal of the differential amplifier 20 to measure the output voltage of the differential amplifier 20, while it performs leak detection at a leak detection time by connecting the output of the positive electrode resistance voltage dividing circuit to the positive phase input terminal of the differential amplifier 20 and connecting the negative input terminal of the differential amplifier 20 to the ground to measure the output voltage of the differential amplifier 20, it can perform total voltage detection and leak detection with a reduced size and at a low cost without using a special insulation type voltage sensor using a hall element or the like, an insulation power source, photo-couplers, or the like which was required in the conventional total voltage detection and leak detection circuit. By adopting an integrated circuit for a part of a circuit, a required function can be achieved only by using the AD converter in the MC 8 which is a main control circuit element to conduct connection of the voltage dividing resistor. Since the integrated circuit 19 is used for the detection circuit 30, the number of parts is largely reduced so reliability can be raised, and precision of voltage detection and leak detection can be raised by trimming a resistance for differential amplifier in the integrated circuit 19.

Incidentally, in the embodiment, the example that the integrated circuit 19 is constituted separately from the MC 8 has been shown, but further compact apparatus (circuit) configuration can be achieved by mounting the integrated circuit 19 in the MC 8. Further, the leak detection based upon the ratio of the leak detection measurement value to the total voltage measurement value was shown in the embodiment. However, it goes without saying that leak detection based upon the ratio of the total voltage measurement value to the leak detection measurement value may be employed.

INDUSTRIAL APPLICABILITY

Since the present invention provides an assembled battery total voltage detection and leak detection apparatus with a reduced size at a low cost, it contributes to manufacturing and marketing of an assembled battery total voltage detection and leak detection apparatus, so that it has industrial applicability.

What is claimed is:

1. An assembled battery total voltage detection and leak detection apparatus comprising:
   a control circuit which measures a total voltage of an assembled battery;
   a first resistance voltage dividing circuit which is inserted between a positive electrode terminal of the assembled battery and a ground terminal of the control circuit; and
   a second resistance voltage circuit which is inserted between a negative electrode terminal of the assembled battery and the ground terminal of the control circuit,
   wherein the control circuit measures output voltages of the first and second resistance voltage dividing circuits, detects a total voltage of the assembled battery based upon a sum of absolute values of the measured output voltages of the first and second resistance voltage dividing circuits, and detects leak between the assembled battery and the ground according to a ratio of the measured output voltage of the first resistance voltage dividing circuit and the sum of the absolute values of the measured output voltages of the first and second resistance voltage dividing circuits.

2. An assembled battery total voltage detection and leak detection apparatus according to claim 1, wherein resistors constituting the first and second resistance voltage dividing circuits are set to have at least specified insulation resistance values.

3. An assembled battery total voltage detection and leak detection apparatus according to claim 2, wherein the control circuit has a differential amplifier, and the control circuit performs detection of a total voltage of the assembled battery at a measurement time of the total voltage by connecting the output of the first resistance voltage dividing circuit to a positive input terminal of the differential amplifier and connecting the output of the second resistance voltage dividing circuit to a negative input terminal of the differential amplifier to measure an output voltage of the differential amplifier.

4. An assembled battery total voltage detection and leak detection apparatus according to claim 3, wherein the control circuit performs leak detection at a leak detection time by connecting the negative input terminal of the differential amplifier to the ground to measure an output voltage of the differential amplifier.

5. An assembled battery total voltage detection and leak detection apparatus according to claim 4, wherein the differential amplifier is mounted in an integrated circuit, such that the negative input terminal can be switched to the ground.

6. An assembled battery total detection apparatus according to claim 5, wherein the integrated circuit is configured such that the negative input terminal can be switched to the ground therein.

7. An assembled battery total voltage detection and leak detection apparatus according to claim 1, wherein the first resistance voltage dividing circuit includes at least three resistors connected in series.

8. An assembled battery total voltage detection and leak detection apparatus according to claim 7, wherein a resistance value of each resistor constituting the first resistor voltage dividing circuit is 1 MΩ or more.

9. An assembled battery total voltage detection and leak detection apparatus according to claim 1, wherein the second resistance voltage dividing circuit is composed of at least two resistors connected in series.

10. An assembled battery total voltage detection and leak detection apparatus according to claim 8, wherein a resistance value of each resistor constituting the second resistor voltage dividing circuit is 10 KΩ or more.

* * * * *